United States Patent [19]

Dubauskas

[11] 4,258,317

[45] Mar. 24, 1981

[54] COMBINATION ANALOG-DIGITAL INDICATOR

[75] Inventor: Thomas A. Dubauskas, Waterbury, Conn.

[73] Assignee: The Lewis Engineering Company, Naugatuck, Conn.

[21] Appl. No.: 29,569

[22] Filed: Apr. 12, 1979

[51] Int. Cl.³ .......................... G01R 1/00; G01R 1/08
[52] U.S. Cl. .......................................... 324/114; 324/96
[58] Field of Search ............... 324/115, 99 D, 96, 114; 356/331 R, 336; 73/490; 116/286, 300

[56] References Cited

U.S. PATENT DOCUMENTS

| 2,623,182 | 12/1952 | Russell | 73/490 |
| 3,421,083 | 1/1969 | Bosworth et al. | 324/99 R |
| 3,689,835 | 9/1972 | Bickford | 324/114 |

Primary Examiner—Ernest F. Karlsen
Attorney, Agent, or Firm—H. Gibner Lehmann; K. Gibner Lehmann

[57] ABSTRACT

An electrical indicator device for providing simultaneous relatively coarse analog, and higher-resolution, digital readings of a particular electrical parameter, all in one instrument. The device includes a d'Arsonval meter movement which carries a pointer movable over a predetermined portion of a calibrated meter scale plate, and a liquid crystal display having multiple digits, each digit being constituted of multiple segments. The segments are disposed completely within the confines of the meter scale plate, but lie substantially completely outside of the said predetermined portion thereof. The display is driven or energized by a digital voltmeter having its terminals connected to receive and monitor the same parameter that is being measured by the d'Arsonval movement. The arrangement is such that the individual segments of the digital display are always completely visible regardless of the position which the pointer occupies with respect to the said predetermined portion of the scale plate.

14 Claims, 9 Drawing Figures

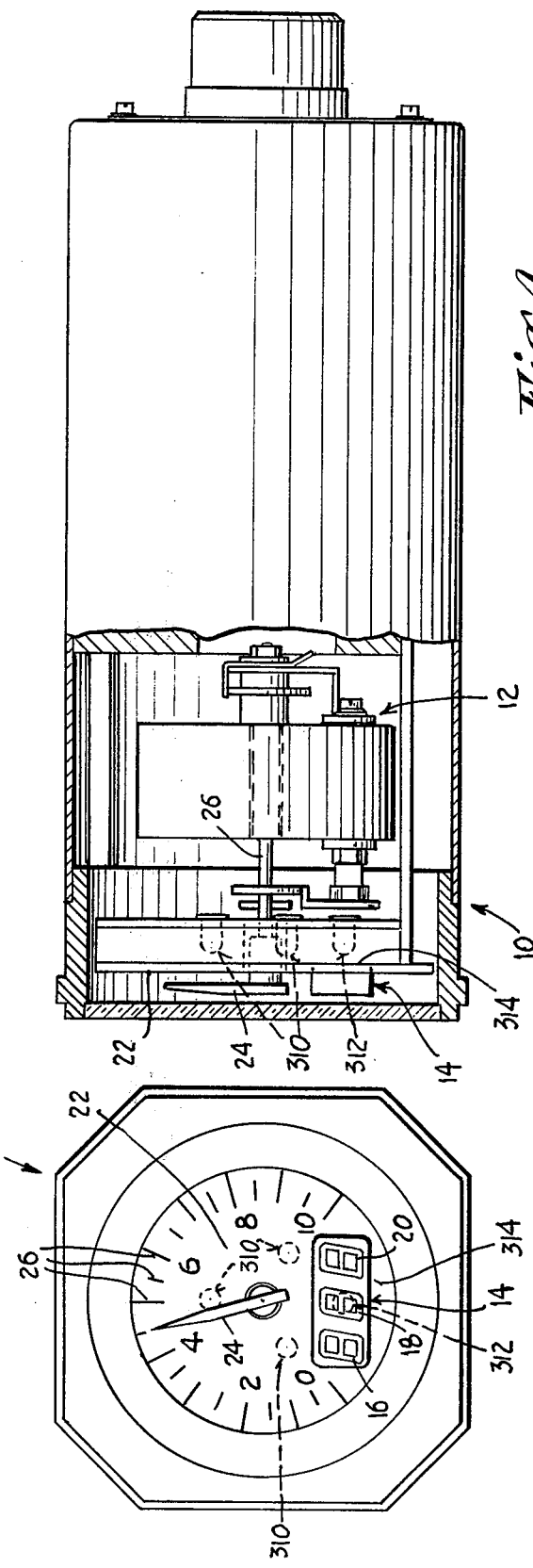

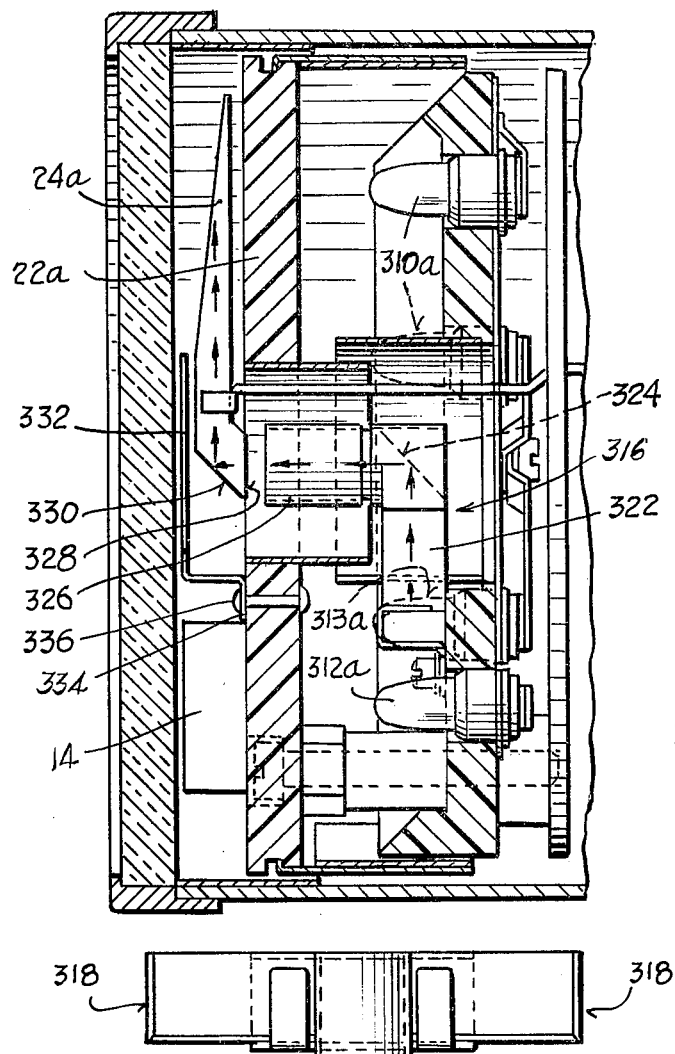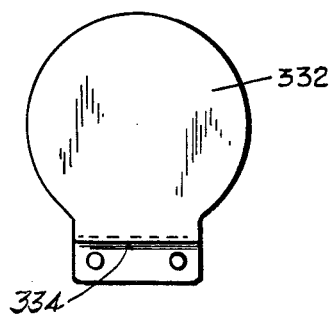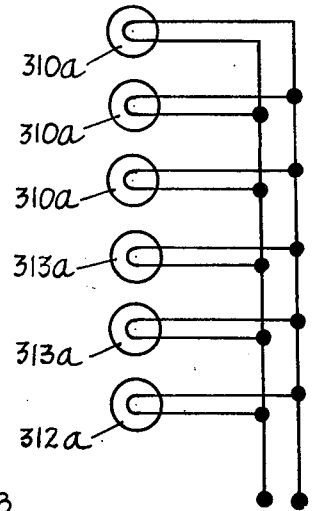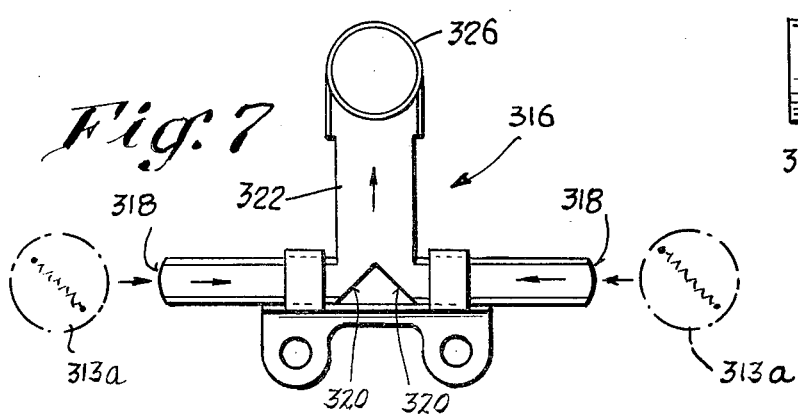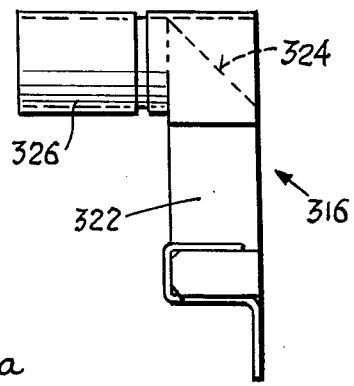

COMBINATION ANALOG-DIGITAL INDICATOR

BACKGROUND

This invention relates generally to electrical measuring instruments, and more particularly to instruments of the type employed in aircraft and used to measure fuel levels, temperatures, and pressures at various locations on the craft, or to measure other parameters associated therewith.

For a number of years, aircraft instrument panels have been provided with relatively simple, basic d'Arsonval type movements for monitoring the various engine and speed parameters normally associated with flying and maneuvering such craft. Many prior innovations have been devised over the years, for improving the visibility of the pointers and scales employed with such instruments. Advances in lighting have been particularly noteworthy, since the personnel in the cockpit experience wide lighting conditions, from virtual full sunlight, to very low ambient levels, as at night or at dusk. Since there are hundreds of indicators on a typical instrument panel, and since the pilot must monitor or check a large number of readings during the normal course of operation, it is imperative that a particular instrument be relatively easy to see, and to read at a glance, from a number of different positions both in front of and to the side of the instrument face.

While the conventional analog instruments have functioned generally well over the years, they sometimes left something to be desired as far as providing high accuracy readings quickly. In most cases, in order to obtain a high resolution reading, it was necessary to view the pointer head-on (to eliminate parallax), and thereafter do some additional interpolation of the reading in the event that the pointer was disposed between adjacent hatch marks of the calibrating indicia. While it is often not essential that all readings taken by a pilot be pin-pointed to a high degree, those which did warrant an accurate determination required additional time as well as extra mental effort by the pilot.

Until only recently, the use of digital displays for electronic instrumentation was generally confined to laboratory equipment, due to the relatively complex circuitry that was involved in converting analog quantities into digital information without sacrificing conversion accuracy in the process. Digital voltmeters have gained wide acceptance in the past 10 years or so, mainly due to the recently developed capability of packaging an analog-to-digital converter in a single integrated circuit chip. Such digital instruments provide increased resolution over that obtainable with a d'Arsonval movement, but do have several disadvantages. In the event that a malfunction occurs within the instrument, they often do not give an indication that something is wrong. Instead they may merely display a series of digits in the normal manner, such a display conceivably not bearing a true or accurate relationship to whatever is being monitored.

In other cases, the digital display will respond to a transient or other spurious signal, and will provide incorrect readings during the occurence of such a signal. Finally a digital instrument by itself does not provide the operator or viewer with a good feel for the rates of variations in the parameters being monitored, or provide an indication of trends, in the case that a reading is gradually changing. Thus, by itself, a digital instrument leaves something to be desired Aside from the disadvantages noted above, prior digital voltmeters have tended to be physically large and bulky; accordingly, such devices were not in keeping with the strict requirements as to small physical size and weight, which are characteristic of aircraft instruments today.

Several attempts have been made to combine a digital and an analog instrument into a single instrument casing. Due to the complexity of the analog-digital converters associated with such devices, the resulting system was often relatively large or heavy as noted above, making it unsuitable for use in aircraft, where physically small and light weight components are considered a must. In instruments of the above type, where the digital display was located on the face of the analog meter, the pointer associated with the latter often obscured one or more of the digits, or at least interfered with their direct viewing, tending to cause confusion on the part of the operator and sometimes giving rise to an error in taking the particular reading. Accordingly, the combined analog-digital devices of the prior art have not met with much acceptance or success, as far as their use in the aircraft field is concerned.

SUMMARY

The above disadvantages and drawbacks of prior aircraft instruments are obviated by the present invention which has for an object the provision of a novel and improved electrical indicating device for providing both relatively coarse, analog readings and also higher-resolution digital readings of a particular parameter being monitored, such readings being obtained simultaneously and without involving either electrical switching, or interference between the individual parts providing the readings.

A related object of the invention is the provision of a combined analog and digital display in one casing as above characterized, wherein substantially all of the segments of the digital display are completely visible to the operator or pilot, regardless of the relative position of the pointer of the analog instrument with respect to the scale thereof.

Still another object of the invention is the provision of a combination analog-digital indicator device in accordance with the foregoing, wherein both the analog and digital displays are continuously connected in circuit, to thereby yield simultaneous readings of the same electrical parameter and thus provide the viewer or pilot with the benefits of the high accuracy and resolution of a digital display, coupled with the good reliability and feel of an analog instrument.

Yet another object of the invention is the provision of an analog-digital display as above set forth, wherein the segments of the digits of the display are disposed entirely on the scale plate of the meter movement, but lie substantially completely outside of the portion of the scale plate traversed by the pointer, such that the latter does not interfere with or block the view of the segments. Due to the proximity of the digital segments to the pointer and due to the fact that the two displays are disposed inside the same housing and bezel, there cannot occur confusion on the part of the pilot; that is, it is apparent to him that the two displays are part of the same instrument, and are accordingly monitoring the same parameter. Such would not be true in the case where separate analog and digital display units were employed, and disposed in different locations on the instrument panel.

Accordingly, by the above arrangement there is provided an improved device which saves time and reduces the likelihood of confusion, both considerations being extremely important from the standpoint of aircraft safety as it relates to pilot error.

The above objects are accomplished by a unique electrical indicator device which is so arranged that it provides simultaneous analog and digital readings of a particular electrical parameter, all in one instrument. A d'Arsonval meter movement is employed, carrying a pointer movable over a predetermined portion of a calibrated meter scale plate. Also provided is a liquid crystal display having multiple digits, each digit being constituted of multiple segments, located completely within the confines of the meter scale plate, but being disposed substantially completely outside of the said predetermined portion thereof. The display is driven by a digital voltmeter having its terminals connected to receive and monitor the same parameter being measured by the d'Arsonval movement. The arrangement is such that the individual segments of the digital display are always completely visible, regardless of the position which the pointer occupies with respect to the said predetermined portion of the scale. The unit is light in weight and has a small physical size, in keeping with the requirements of modern aircraft instrumentation. Moreover the advantages of both types of displays are retained, without causing conflict, or leading to confusion or doubt in the mind of the pilot or operator.

As disclosed, the individual segments of the digital display are not only completely visible regardless of the pointer position, but are also physically large in size as regards their height and width and in comparison to the indicia of the d'Arsonval movement. This gives the important advantage that the user or operator can simultaneously, very quickly secure the desired information because the two indicators that are provided i.e. the illuminated pointer that is movable over the scale on the one hand, and the digital readout on the other hand, are both physically of relatively large size. The pointer, for example, can have a length which is roughly twice the height of the digital segments. Since the digital segments are themselves relatively physically large, the user has the advantage gained by viewing large surfaces, not only those of the digital designations but also those of the analog designations represented by the pointer. The designation given by the pointer is roughly determined by its angular position, and in some cases a danger zone is provided on the scale, representing also a large designation. Thus, the physically smaller numbers on the scale of the d'Arsonval movement need not be read except in unusual situations; when the operator glances at the instrument he can merely note the angular position of the pointer and also the readings of the digital readout. This information is obtainable by a quick glance, and provides a visual check as between the pointer's position and the information intended to be conveyed thereby. The operator thus need not look especially close, to read the smaller numbers on the scale of the d'Arsonval movement. An important relationship exists between the size of the digital readout characters and the length of the pointer, since both are relatively large and since the pointer's position need not necessarily be referred to the indicia which are cooperable with the pointer. The present instrument thus gives an improved result not heretofore obtainable.

The pointer is illuminated, and is movable over an arc of roughly 270°; the remaining 90° arc of the dial is occupied by the digital readout segments. Where a total of three segments is provided for such 90° space, the segments can be physically large, thereby providing the advantages noted above.

The instrument additionally has back lighting for the indicia readout segments, which eliminates shadows and facilitates the reading of the segments, this being in addition to back lighting that is provided for the pointer and also for illumination of the indicia on the dial associated with the d'Arsonval movement. Such indicia are preferably edge-lighted, and the pointer which is movable over the dial can be illuminated by prisms as disclosed herein, thereby resulting in the utmost ease in obtaining the required readings.

Other features and advantages will hereinafter appear.

In the accompanying drawings:

FIG. 2 is a front elevational view of the indicator device, particularly showing the digital display portion thereof.

FIG. 3 is a side view, partly in side elevation and partly in section, of the indicator device of FIG. 2.

FIG. 4 is a schematic circuit diagram of the incandescent lighting arrangement for the instrument of FIGS. 2 and 3.

FIG. 5 is a fragmentary axial sectional view of the front portion of another embodiment of dual-indicating instrument as provided by the invention, illustrating particularly a specific advantageous lighting arrangement which can be employed.

FIG. 6 is a front elevational view of a light masking member provided for the instrument of FIG. 5.

FIG. 7 is a front elevational view of a prismatic light directing member as utilized in the instrument of FIG. 5.

FIG. 8 is a top plan view of the prismatic member of FIG. 7.

FIG. 9 is a side elevational view of the prismatic member of FIG. 7, and

FIG. 10 is a schematic circuit diagram of the incandescent lamp circuit of the instrument of FIG. 5.

Figure 1:
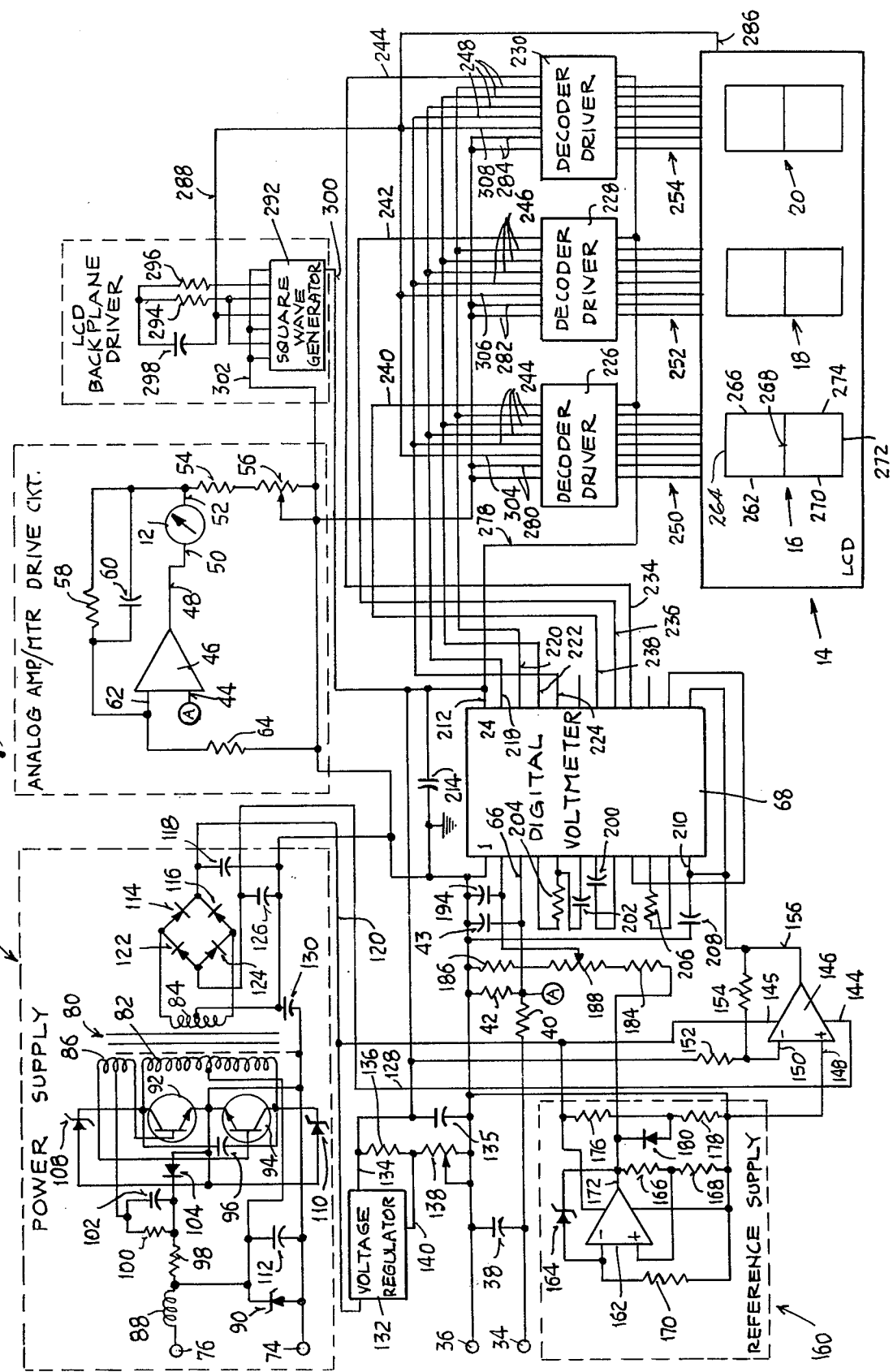
FIG. 1 is a schematic circuit diagram of the improved electrical indicator device of the present invention.

Referring to FIGS. 2 and 3 and in accordance with the present invention there is illustrated a novel and improved electrical indicator device for providing simultaneous and continuous analog and digital readings of a particular electrical parameter, the device being generally designated by the numeral 10 and comprising a d'Arsonval meter movement 12 and an integral liquid crystal display 14 comprising multiple digits 16, 18 and 20. As particularly shown in FIG. 2 the instrument is provided with a meter scale or face plate 22, over which a pointer 24 is movable, the latter being carried by the rotor 26 of the d'Arsonval movement 12 in the conventional manner. The meter face plate 22 has a series of index marks 26, constituting calibrating indicia, and further includes numerical designations associated therewith.

In accordance with the invention, the pointer 24 is movable over a predetermined portion of the scale 22, namely that portion illustrated in FIG. 2 which lies within the circumference defined by the index marks 26 and falling within an arc defined by the lowest and highest numerical designations, with the integral liquid crystal display 14 also being located within the meter scale plate, but being disposed substantially completely outside of the said predetermined portion thereof. By the above construction, each of the digits 16, 18 and 20 is continuously visible from in front of the instrument, regardless of the position of the pointer 24 with respect to the scale plate 22. Such an arrangement has been found to be highly desirable from the standpoint of visibility, since the pointer 24 never obscures or interferes with a direct reading of the digits 16–20. By virtue of the fact that the liquid crystal display 14 is disposed in such close proximity to the pointer 24 and scale associated therewith, there is eliminated any possibility of confusion; that is, it is clear to the viewer that the same parameter is being monitored on both the analog and the digital displays. This is particularly important in aircraft instrumentation where there are typically hundreds of meters and/or gauges which have to be visually checked, often in rapid succession and in the presence of other distractions such as radar and the necessity for avoidance of other aircraft, radio communication with the ground, and verbal communications with personnel in the cockpit.

FIG. 1 shows a schematic circuit diagram of the indicator device of the present invention. The indicator has input terminals 34, 36, the latter being considered the ground side of the circuit, these being adapted to be connected to the source of voltage to be monitored or measured. Typically the range of voltage intended to be measured is from 0 to 0.99 volts d.c., but other ranges could be accomodated, as well. Connected across the terminals 34, 36 is a filter or by-pass capacitor 38 which eliminates transients and tends to prevent erroneous readings from appearing on the digital display, to be described below. Divider resistors 40, 42 constitute a signal processing electrical network, and are selected to suit the particular input voltage range employed. The junction of the resistors 40, 42 has a by-pass capacitor 43 to ground, and extends to a lead designated by the letter A, which is intended to be connected to a similarly lettered lead A connected to the input terminal 44 of an amplifier 46; the latter has an output lead 48 extending to one terminal 50 of the d'Arsonval movement. The other terminal 52 of the movement is connected to resistors 54 and 56, the latter being variable and extending to ground. Also connected to the terminal 52 are a feedback resistor 58 and a frequency compensation or roll-off capacitor 60, which in turn extends back to the other or second input terminal 62 of the amplifier 46. A biasing resistor 64 extends from this terminal to ground, as shown. The amplifier 46 may be of the integrated circuit variety, and of the type known by the commercial designation LM158, manufactured by National Semiconductor and others. The LM158 package contains two separate amplifiers, one of which is employed as the amplifier 46.

The junction of the divider resistors 40, 42 is also connected to the input 66 of a digital voltmeter. The latter is generally designated by the numeral 68, and is shown as being of the integrated-circuit variety, with the analog-to-digital converter portion of the digital voltmeter being disposed within a single package. The device can be obtained commercially under the No. MC14433, manufactured by Motorola Semiconductor Products, Inc. The pin numbers 1–24 as shown, correspond to this unit. The voltage appearing on the input terminal 66 is compared with a reference voltage obtained from a reference supply to be described shortly. Input pin 1 is connected to ground as shown.

Referring again to FIG. 1, power is supplied from the aircraft electrical system to the two terminals generally designated 74 and 76. This voltage is typically 28 volts d.c. In order to convert this d.c. voltage to lower levels and provide increased stability, there is provided an invertor type power supply generally designated by the numeral 78, and comprising an inverter transformer 80 having a center-tapped primary winding 82, a secondary winding 84, and an auxiliary winding 86 which provides a feedback signal for driving the invertor transistors to be described below.

Connected to the input terminal 76 is a series inductance 88, and a zener diode 90 constituting a clamp which protects the transistors in the supply 78 from high-voltage spikes or incoming transients. The transistors aare designated 92 and 94, and have their collectors respectively connected to the ends of the primary winding 82. Their emitters are connected together and extend to the terminal 74. A capacitor 96 is also connected between their collectors. Each base receives drive from the auxiliary winding 86 of the transformer 80. In addition, resistors 98, 100 and capacitor 102 are also provided, these being involved with establishing bias for the bases of the transistors 92, 94. Diode 104 provides reversebias protection for the base-emitter junctions of each of the transistors 92, 94. Additional protection against transients (which might damage the collector-base junctions of the transistors 92, 94) is provided in the form of zener diodes 108, 110. As shown, these extend from the collector of each transistor to the common emitter connection thereof. Accordingly, any transients resulting from start-up of the power supply 78, or from momentary surges associated with such start-ups are effectively clamped to a safe level by such diodes. An additional filter capacitor 112 is provided, which together with the inductance 88, tends to smooth out any ripple or square-wave energy which might otherwise leak out past the terminals 74, 76 and into other equipment supplied by the aircraft's electrical system.

The secondary winding 84 of the transformer 80 is center tapped as shown, and is connected to two full-wave rectifier circuits, one providing a positive output and the other providing a negative output. The positive output is obtained from the diodes 114, 116 which are connected to a filter capacitor 118, these providing a positive (unregulated) output voltage on line 120. Negative output is obtained from the diodes 122 and 124 which extend to a filter capacitor 126, these providing a negative (unregulated) output voltage on line 128. A by-pass capacitor 130 is provided, extending between the ground side of the signal input terminals 34, 36 and the negative side of the power input terminals 74, 76.

The unregulated voltage on line 120 is fed into the input terminal of an integrated-circuit voltage regulator 132, which may be of the type having the commercial designation 1F78L 62AC. The regulator provides, on the output lead 134, a regulated voltage +5.0 volts d.c. A by-pass capacitor 135 extends to ground, as shown. Resistor 136 and potentiometer 138 are associated with the regulator, to sense the output voltage on line 134 and provide a feedback signal to the remaining terminal 140 of the integrated circuit 132. Initial adjustment of the 5.0 volt level is made by adjustment of the potentiometer 138.

The unregulated negative voltage appearing on line 128 is fed to the negative supply terminal 144 of an amplifier 146 which may be of the type known by the commercial designation LM158, the amplifier having its positive supply terminal 145 connected to line 120, and having its non-inverting input terminal 148 connected to ground. The voltage applied to the inverting input 150 is obtained from two resistors 152, 154, the resistor 152 being connected to the line 134 which carries +5.0 volts d.c. regulated. The values of resistors 152, 154 are chosen such that the amplifier 146 will provide an output voltage on line 156 of −5.0 volts d.c. Due to the negative feedback provided by the resistor 154, this −5.0 volt d.c. level is held very constant and can be considered to be a regulated voltage.

Referring again to FIG. 1, there is further provided a reference supply generally designated by the numeral 160, comprising an amplifier 162 which may be of the type known by the commercial designation LM158, a zener or reference 164, divider resistors 166, 168, and biasing resistor 170. This reference supply 160 provides a positive regulated voltage of high stability at the output 172 of the amplifier 162. Any tendency for a change in the level of the voltage on line 172 is sensed (through the zener 164) and fed back to the inverting input of the amplifier 162, with the latter operating to restore the output voltage in a direction opposite to the change. Additional resistors 176 and 178 are provided, together with a diode 180, these latter three components being involved with insuring that the amplifier 162 does not suffer a latch-up condition when the system is first energized. It will be understood that by making the zener diode 164 a temperature compensated unit, and by selecting an amplifier 162 which has low offset and drift, the voltage appearing on the output 172 can be held to a steady value, largely independent of fluctuation which occurs due to changes in the supply voltage applied to terminals 74, 76, and due to changes in the loading characteristics of the various circuitry on the line 120 and the line 128. This highly stable voltage on line 172 is fed to a divider or calibrating circuit of resistors 184 and 186, and potentiometer 188. The tap on the potentiometer 188 is connected to a filter capacitor 194, and thence to the second input terminal of the digital voltmeter 68. The potentiometer 188 is involved with calibration of the digital voltmeter, as will be explained below.

Referring again to FIG. 1, there are associated with the digital voltmeter 68 various components including a capacitor 200 constituting an offset correction capacitor, a capacitor 202 and resistor 204 which are associated with determining an integration interval associated with the analog-digital conversion, and a resistor 206 which is employed to set a clock frequency within the integrated circuit. A filter capacitor 208 extends from the negative supply lead 210 of the digital voltmeter 68 to ground. Regulated voltage from line 134 is applied to the positive supply terminal 212 of the digital voltmeter and a filter capacitor 214 extends from this terminal to ground, as shown.

Output from the digital voltmeter 68 is taken from terminals 218, 220, 222, and 224 in binary coded decimal (BCD), and applied to a series of three integrated circuit devices 226, 228, and 230, known as "liquid crystal display latch/decoder/drivers." These are available commercially under the number MC14543B, manufactured by Motorola and others. Additional outputs 234, 236, and 238 are provided, applied respectively to terminals 244, 242, and 240 of the decoder/drivers 230-226. These outputs 234-238 are involved with multiplexing the output signals on lines 218-224, such that three digits of information can be transmitted on the lines 218-224, the information corresponding to each digit being sent over a fraction of the entire sampling cycle, as determined by the multiplexing pulses on lines 234-238. The BCD information on lines 218-224 is applied to four terminals indicated by the numeral 244 of the decoder/driver 226 during a first portion of the clock cycle of the digital voltmeter 68, and thereafter to four terminals indicated by the numeral 246 of the decoder/driver 228 during a second portion of the clock cycle, and finally to the terminals indicated by the numeral 248 during a third portion of the cycle. It will be understood that the decoder/drivers 226-230 store the information received on their respective input lines 244-248 during such time as either of the other two decoder/drivers is receiving binary information, and transmits this information via seven output lines 250, 252, 254 respectively to the liquid crystal display digits 16, 18 and 20. It will be understood that in the case of the decoder/driver 226, the seven output lines 250 correspond directly to the seven segments making up the liquid crystal display 16. These seven segments are designated in FIG. 1 by the numerals 262, 264, 266, 268, 270, 272 and 274, and constitute the digit 16. The binary ones and zeros appearing respectively on lines 250 result in selective energization of the segments 262-274, this giving rise to the appearance of a particular numerical display.

In a similar manner, the seven lines 252 correspond to the seven segments of the digit 18, this also being the case with the seven lines 254 and the digit 20. Power is supplied to the decoder/drivers 226-230 via a line 278 which extends to line 134 of the voltage regulator 132. Two terminals 280 of the decoder/driver 226 are grounded as shown, this being true of terminals 282 and 284 of the remaining decoder/drivers 228 and 230 respectively.

In addition to the seven segments associated with each liquid crystal display digit, there is also a common electrode shared by these digits, referred to as the liquid crystal display backplane. This electrode is designated by the numeral 286, and is shown as being connected to a line 288 which carries a low-frequency square wave signal (on the order of 100 cycles) that is produced by a square wave generator comprising an integrated-circuit multivibrator 292, associated resistors 294, 296, and capacitor 298, these latter components establishing the frequency and shape of the square wave on line 288. Power is supplied on line 300, which is connected to the regulated line 134, as shown. Other terminals of the integrated circuit 292 are grounded by a line 302, as shown.

The line 288 also extends to additional terminals 304, 306, and 308 of the decoder/drivers 226-230. The square wave on this line, when applied to the decoder/drivers, gives rise to pulsing of the digital information on lines 250-254, such pulsing being out of phase with the square wave as it is applied to the backplane 286, this being necessary from the standpoint of producing the desired contrast between the segments of the liquid crystal display which are being driven and those that are not.

The unit is calibrated by applying a known reference potential to the terminals 34, 36 and thereafter adjusting the potentiometer 188 until the liquid crystal display 14 indicates the proper digits corresponding to the magnitude of the reference voltage. In a similar manner, the potentiometer 56 can be set to provide the desired reading corresponding to the magnitude of the reference potential, on the d'Arsonval movement 12.

In operation, the terminals 34, 36 are connected to a suitable source (not shown) providing an output voltage which is indicative of the particular parameter being monitored. This is typically in the range from 0-1.0 volts d.c., but other ranges could readily be employed as well.

The indicia on the dial 22, comprising the graduations 26 and the numerals associated therewith, are adapted to be edge lighted, as by engraving the dial 22 and providing an opaque field surface against which the indicating material will stand out. Three incandescent lamps, labelled 310, are disposed to the rear of the dial 22; the light from such lamps passes in all directions through the transparent material of the dial. At the places where the dial is engraved the light is manifested, this constituting the so-called edge-lighting employed in instrumentation.

In accordance with the present invention, the digital readout members 16, 18 and 20 are back lighted, as by means of an incandescent lamp 312 which is located to the rear of the readout. The dial 22 of the instrument has a rectangular opening 314 through which the light from the lamp 312 can pass. Such back lighting of the digital readout eliminates shadows and enables the operator to more quickly and accurately determine the values indicated by the digital segments.

The pointer 24 is also illuminated, and this can be done utilizing a prism system as illustrated in FIGS. 5 and 6. Details illustrated in these figures are not shown in the smallsize representations of FIGS. 2 and 3, but it should be understood that the instrument in FIGS. 2 and 3 can be constructed in various ways, one of which is shown in greater detail in FIGS. 5-9. Here, a known lighting arrangement is provided for effecting adequate illumination of the pointer of the d'Arsonval movement. Pointer illumination of a d'Arsonval instrument movement is also illustrated, described and claimed in U.S. Pat. No. 3,559,616 issued to Donald E. Protzmann and having the same ownership as the present invention and application. The showing of this Protzmann patent is therefore a part of the present disclosure, since the pointer-illumination system of the patent is adaptable to illuminate the pointer 24 of the instrument movement of FIGS. 2 and 3.

Referring now in detail to FIGS. 5-9, a collector prism member 316 at the rear of the dial 22a receives light from lamps 313a (shown in dotted outline in FIG. 7), and directs such light forwardly through the center opening in the dial 22a.

The light from the lamps 313a is collected by lens surfaces 318, reflected by prism surfaces 320 to pass through a radial light pipe portion 322 so as to strike a prism surface 324, by which it is reflected forwardly through a light pipe portion 326. From such portion 326 the light strikes a receiving surface 328 of the pointer 24a, and is reflected by a prism surface 330 so as to pass longitudinally along the pointer toward the tip portion thereof. This light illuminates the entire pointer, for the exposed length thereof.

A mask member 332 obstructs light and prevents it from passing forwardly in the area of the axis of the pointer, such mask being secured by a bracket portion 334 and rivets 336 to the dial 22a. Thus, it will be understood that, with the opaque portion of the dial 22a constituting a dark or black background, the graduations and indicia on the dial will stand out due to the edge lighting, and the pointer 24a will be seen as an illuminated bar which is movable over the front surface of the dial.

The indicator instrument of the present invention is seen to have a number of distinct advantages. As already mentioned above, one outstanding advantage is the enabling of faster readings to be had, with less conscious effort on the part of the operator while at the same time providing a back-up or check means which produces two readings that can be compared one with the other. A failure of one indicator means can then be immediately detected, due to the discrepency which will be observed in the readings. It is to be especially noted that both the analog and the digital displays are always connected in circuit, and thus continuously monitor the same voltage, namely that appearing between the terminals 34 and 36. Accordingly there are no buttons or levers that have to be actuated, in order to obtain the desired reading. Due to the close proximity of the liquid crystal display 14 to the pointer 24 and index marks 26, there is eliminated any possibility of confusion on the part of the operator, since it is abundantly cler to him that both the analog reading and the digital reading constitute an indication of the same electrical parameter. By virtue of the fact that the pointer 24 never passes in front of the digits 16, 18, and 20, no problems with interference are encountered, thus reducing the likelihood of confusion, and minimizing the possibility of erroneous readings being taken. This is especially important in aircraft instrumentation where the pilot is continuously called upon to make a number of checks or readings, often in rapid succession and with no room for error. The unit enjoys the small physical size, low power consumption, and reliability of solid state circuitry, which is especially important in keeping with the strict space and weight limitations, as well as the safety requirements of modern aircraft equipment.

An especially important feature of the invention involves the unique physical arrangement and relative size of the indicators which are to be viewed by the pilot or operator. For many readings, the operator need not read or interpret the small digits or indicia which identify the graduations on the meter scale 22, but instead will view the two larger indicator readouts, namely the illuminated pointer 24 and the digital segment members 16, 18 and 20. Both of these are relatively large physically, and when viewing them at a glance the angular position of the pointer 24 will merely be checked with the digits of the segment display members 16, 18 and 20. The meter pointer 24 is disposed immediately above the segment members, the latter being disposed in mutual horizontal alignment below the central opening in the scale 24 which provides clearance for the pointer mount. The pilot or operator, if familiar with the scale on the dial 22, can know by the angular position of the pointer 24 approximately what the numerical readout should be, and he will compare this angular position of the pointer with the segment digit members 16, 18 and 20 for a correlation. It is not necessary, in most circumstances, to take the time or make the effort to closely read the pointer position on the dial; this is only important if a questionable correlation exists between the pointer position and the digital readout. Thus, with the arrangement as provided by the present invention, there is had the utmost convenience in obtaining the desired information, and this can be done by a quick glance without requiring the operator to more closely focus, and to go through the additional mental steps of using the exact position of the pointer to secure a numerical value as obtained from the dial 22.

The convenience and advantage of the present improved instrument is thus to a great extent due to the location of physically relatively large, adjoining indicator devices which have easily read, large viewing surfaces, such as the pointer 24 and the digital readout members 16, 18 and 20. In consequences, the viewing and obtaining of the desired information is greatly facilitated.

The device of the present invention is thus seen to represent a distinct advance and improvement in the technology of electrical indicating instruments.

In the appended claims the face plate 22 is also referred to as a meter scale plate, with the marks 26 covering a useful indicating area. The pointer 24 is thus seen to be movable over the said useful indicating area, through a visible arc or range of essentially 270° whereby there is had an easily-readable, expanded-scale type of indication. The indicator device input terminals 34, 36 constitute the input circuit which is adapted to be connected to the exciting source of the parameter being monitored. Also connected with this input circuit is ground pin 1 and input lead 66 of the digital voltmeter, these constituting an input circuit of the digital voltmeter. The output leads 218, 220, 222, 224, 234, 236 and 238 are seen to be connected to provide drive signals to the liquid crystal display 14. Such display is, in accordance with the invention, disposed closely adjacent the useful indicating area of the scale plate 22 but lies completely outside of said area and also outside of the visible range of movement of the pointer 24 so as to be not interfered with by the latter.

Thus, all of the display segments are always completely visible at a single glance from the front of the indicator device simultaneously with the viewing of said useful indicating area and regardless of the visible position of the pointer 24 on the area having the marks 26.

Each and every one of the appended claims defines a distinct aspect of the invention separate from the others, and each claim is accordingly to be treated in this manner when the prior art devices are examined in any determination of novelty or validity.

Variations and modifications are possible without departing from the spirit of the invention.

I claim:

1. An electrical indicator device for providing continuous and simultaneous analog and digital readings of a particular, single electrical parameter which is to be continuously monitored, comprising in combination:
   (a) a d'Arsonval meter movement,
   (b) a meter scale plate having a useful indicating area provided with calibrating indicia,
   (c) a pointer carried by said d'Arsonval movement and movable over said useful indicating area,
   (d) said indicator device having an input circuit adapted to be connected to the source of the parameter being monitored,
   (e) a liquid crystal digital display, and
   (f) a digital voltmeter having its input connected to the input circuit of the device, and having an output connected to drive the liquid crystal display,
   (g) said display comprising multiple digits, each digit having a backplane and multiple segments which are selectively energized to produce numerical designations,
   (h) said segments being disposed closely adjacent said useful indicating area but lying completely outside of the same, and being disposed outside of the useful range of movement of the pointer so as to be not interfered with by the latter whereby all of said segments are always completely visible in a single glance from the front of the indicator device simultaneously with the viewing of said useful indicating area and regardless of the position of the pointer on said area,
   (i) said meter scale plate being substantially circular and having a central opening providing clearance for the pointer support,
   (j) said multiple segments of the digital voltmeter being located below the central opening of the scale plate,
   (k) said d'Arsonval movement and liquid crystal display being permanently connected to continuously measure the single, same electrical parameter being monitored,
   (l) means for electrically illuminating the pointer along its length, and
   (m) a light mask for shielding light from said means forwardly of the pointer.

2. The invention as defined in claim 1, and further including:
   (a) means including a signal processing electrical network connected between one of said input terminals and a terminal of the d'Arsonval movement, for modifying the signal from said source.

3. The invention as defined in claim 1 and further including:
   (a) a calibrating circuit associated with said digital voltmeter, for effecting a predetermined digital reading on said display in response to the application of a highly accurate voltage to the input circuit of the indicator device.

4. The invention as defined in claim 1 and further including:
   (a) means including a square wave generator, for applying an alternating voltage to the backplane of said liquid crystal segments, so as to extend their operating life.

5. The invention as defined in claim 1 and further including:
   (a) means including a decoder-driver circuit interposed between the output of the digital voltmeter and the segments of the liquid crystal display digits, for storing digital information received from the digital voltmeter and providing a substantially continuous drive signal to the said digits.

6. The invention as defined in claim 1 wherein:
   (a) said meter scale plate is disposed in a substantially vertical plane,
   (b) the said useful indicating area of said scale plate being disposed in the upper part thereof,
   (c) said display segments being disposed substantially completely within the lower one-half of said scale plate.

7. The invention as defined in claim 1 and further including:
   (a) light means disposed at the rear of the backplane of the liquid crystal display, providing back lighting for the said multiple segments so as to minimize shadows which would otherwise obscure the images produced by the digits.

8. The invention as defined in claim 1, and further including:

(a) said scale plate comprising a transparent member having said indicia,
(b) said indicia being adopted for edge lighting, and
(c) light means disposed at the rear of said transparent member, providing light in said member to effect the edge lighting of said indicia.

9. The invention as defined in claim 8, and further including:
(a) light means disposed at the rear of the backplane of the liquid crystal display, providing back lighting for the said multiple segments so as to minimize shadows which would otherwise obscure the images produced by the digits.

10. The invention as defined in claim 1 wherein:
(a) the useful indicating area of the meter scale plate is roughly equal to three right angles, and
(b) the multiple segments of the digital display occupy roughly the remaining one right angle of the scale plate.

11. The invention as defined in claim 10, wherein:
(a) the multiple segments of the digital display are three in number, and extend in a horizontal row across the lower portion of the scale plate.

12. The invention as defined in claim 11, wherein:
(a) the center one of the segments of the digital display is disposed below the axis of the said pointer.

13. The invention as defined in claim 12 wherein:
(a) the segments of the digital display are more than twice the size of the calibrating indicia carried by the scale plate.

14. The invention as defined in claim 9 wherein:
(a) the light means which provides back lighting for the multiple segments comprises a miniature incandescent bulb, and
(b) the means which provides light to effect the illumination of the pointer and the edge lighting of the indicia on the scale plate comprises three incandescent bulbs,
(c) all of the said bulbs being disposed roughly in a circle extending around the axis of the pointer.

* * * * *